United States Patent [19]
Fisher et al.

[11] Patent Number: 5,920,189
[45] Date of Patent: Jul. 6, 1999

[54] AUTO RANGING CURRENT MONITOR WITH COMMON MODE CORRECTION

[75] Inventors: R. Thomas Fisher; Ronald W Dale; Larry W Soutar, all of Kokomo, Ind.

[73] Assignee: Delco Electronics Corporation, Kokomo, Ind.

[21] Appl. No.: 08/756,471

[22] Filed: Nov. 26, 1996

[51] Int. Cl.$^6$ .................................................. G01R 21/06
[52] U.S. Cl. ........................................ 324/115; 324/130
[58] Field of Search .................................. 324/133, 115, 324/99 D, 103 R, 142, 130, 522; 364/483, 487; 340/660, 661; 702/64, 66, 67

[56] References Cited

U.S. PATENT DOCUMENTS

| | | | |
|---|---|---|---|
| 4,303,881 | 12/1981 | Czewien et al. | 324/115 |
| 4,943,764 | 7/1990 | Szente et al. | 324/115 |
| 5,119,019 | 6/1992 | George | 324/115 |
| 5,266,888 | 11/1993 | Aslan | 324/115 |
| 5,278,493 | 1/1994 | Henkelmann | 324/115 |

OTHER PUBLICATIONS

Keithley Instruments, Inc., Keithley Model 2400 Digital Source Meter Brochure, Copyright 1996 (unavailable month).

Primary Examiner—Vinh P. Nguyen
Attorney, Agent, or Firm—Jimmy L. Funke

[57] ABSTRACT

An improved current monitor for measuring current over a wide dynamic range. The current monitor includes a low current channel, a high current channel, and a switch for selecting the low current channel if the measured current is below a predetermined level and the high current channel if the current is above the predetermined level. The output of the high current channel is voltage encoded by adding a fixed offset. The current monitor determines that the measured current is from the low current channel if the reading is below the offset and from the high current channel if the reading is above the offset. A current level output device automatically outputs a decoded current reading based on this determination. The current monitor also incorporates a low current error compensation circuit to compensate for parasitic current when the current monitor is using the high current channel. The current monitor also incorporates a device for reducing the common mode error voltage to zero in the differential amplifiers used to convert current across shunt resistors in the low and high current channels to a voltage signal.

13 Claims, 5 Drawing Sheets

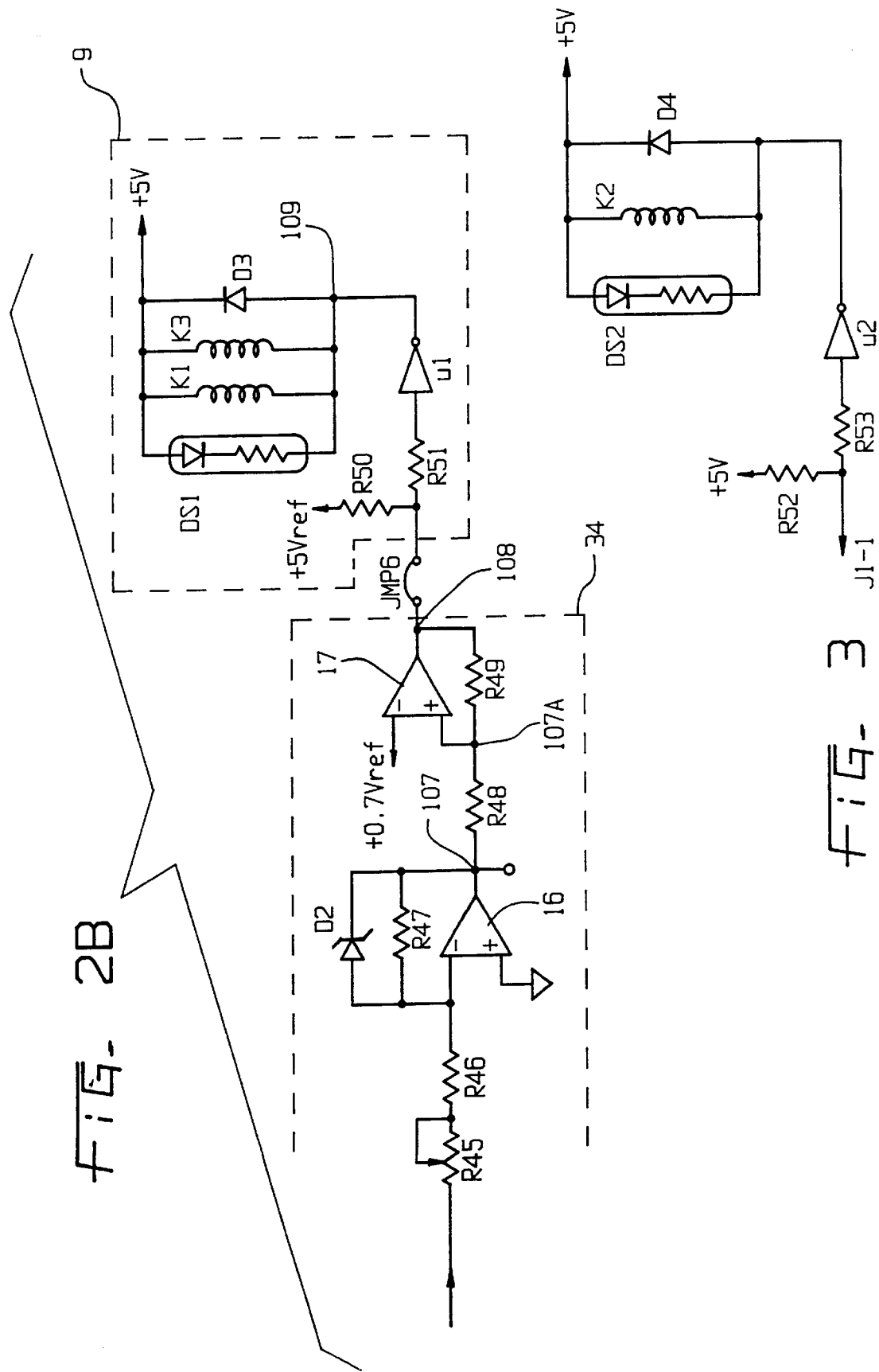

AUTO RANGING CURRENT MONITOR WITH COMMON MODE CORRECTION

BACKGROUND OF THE INVENTION

1. Field of the Invention

The present invention relates to current monitors and more particularly to a current monitor for monitoring and accurately measuring current over a wide dynamic range.

2. Description of the Related Art

Many modern electronic devices draw current over a very wide range. A wide current range is especially inherent in devices designed to operate in a number of different modes, including standby and normal.

In the standby mode, a device usually draws only the necessary amount of current required to keep memory alive. Usually, the memory is established on an integrated circuit device and requires very little current to keep alive. In the normal operating mode, a device may draw current that is several orders of magnitudes higher than the standby mode current. In the normal operating mode, the current must be large enough to drive the internal components of the device, including associated electromechanical devices which can consume large amounts of current. In addition to driving the internal elements of the device, the normal operating mode current may be required to drive external components, for example, speakers in a stereo system. In many such devices, standby current may be as little as 0–50 mA, while normal operating current can go up to several amps.

A current monitor used to measure current through such devices must be capable of accurately measuring current over very wide dynamic ranges. However, conventional current monitors are not capable of accurately measuring current over such wide ranges.

Typical circuitry designed to measure low current levels (<50 mA) would be damaged if high current were passed through it. Also, since larger shunt resistance values are used in low current sensors, the voltage drop developed across the shunt resistor at higher current levels may be large enough to adversely affect the voltage across the load being tested. Further, high current requires very high power resistors and large heat sinks which are not included in low current sensors. On the other hand, circuitry designed to measure high current levels are inappropriate for measuring low current because the larger range prevents the current sensor from being able to sufficiently discriminate between small current level differences.

Therefore, monitoring current over a wide range using conventionally available current monitors requires using either a number of separate current monitors, each having the appropriate current ranges wherein an operator connects and disconnects each monitor from the device as necessary, or a current monitor having several current ranges built in, wherein the operator manually switches between current ranges as necessary. Both solutions require the operator to monitor and respond to the measured current. These solutions are both cumbersome and impractical because the operator may be unable to continually monitor the actual current. Such a solution is also impractical because the current may change so rapidly that the operator is unable to react and shift the current range quickly enough to continuously monitor the current.

SUMMARY OF THE INVENTION

The present invention is capable of accurately measuring current levels over a wide dynamic range by automatically ranging, or switching, between various current range channels, in particular a high current channel and a low current channel, and is capable of encoding the outputs of the various current range channels so that an output device automatically provides the current level output within the proper range. The current monitor monitors the actual current level and switches to the proper range to protect the low current channel from excessive current, and provides low current error compensation to a high current channel to compensate for parasitic current drawn by a low current channel when the high current channel is selected and the low current channel is deactivated. The monitor of the preferred embodiment accurately measures current by incorporating in the high and low current channels a differential amplifier having a common mode adjust mechanism for eliminating common mode error voltage.

The present invention is an automatically ranging current monitor which is capable of measuring current over a wide dynamic range. The current monitor of the present invention comprises a low current channel for measuring current within a low current range, a high current channel for measuring current within a high current range and a voltage switching device for automatically selecting the appropriate channel.

The current monitor of the present invention automatically switches to the appropriate current channel based on the actual load current. The load current is compared with a predetermined reference current level and the current monitor automatically switches ranges as the load current passes through the predetermined reference level. This switching does not require any outside control, thus, the current monitor automatically adjusts and protects itself from an unexpected rise in load current, for example, due to a fault in the device being monitored.

The current monitor of the present invention also incorporates voltage encoding to the outputs of the current channels to indicate to a current output device which current channel is selected. In the disclosed embodiment, the output of the high current channel is encoded by adding an offset to the output of the high current channel. Due to the presence of an offset in the high current channel output, any reading above the offset value is known to be provided by the high current channel and any reading below the offset value is known to be provided by the low current channel. Although not part of the current monitoring section, the current output device is configured to decode the encoded current channel output in order to output the unencoded current level.

Additionally, since some current is still drawn by the low current channel even when the low current channel is inactive, a correction factor is applied to the high current channel output by a low current error compensation circuit.

Finally, the present invention eliminates the effect of common mode error on the differential amplifiers used in the current channels by using a unique feedback configuration.

The current monitor of the present invention may be incorporated into test equipment and measurement devices used in a laboratory environment or into actual working devices including, but not limited to, an electronic monitoring device in an automotive system which alarms if the current is outside a predetermined range, general purpose ammeter, circuits that monitor interior/exterior lights or devices in an automobile to determine when to time out and power down the lights/devices and testers for products with wide dynamic current ranges.

BRIEF DESCRIPTION OF THE DRAWINGS

The above mentioned and other features and objects of this invention, and the manner of attaining them, will become more apparent and the invention itself will be better understood by reference to the following description of the preferred embodiment of the invention taken in conjunction with the accompanying drawings, wherein:

FIGS. 2A and 2B are schematic diagrams of the auto ranging current monitor of the present invention;

FIG. 3 is a schematic diagram of the on/off control circuit for the K2 relay;

Figure 1:
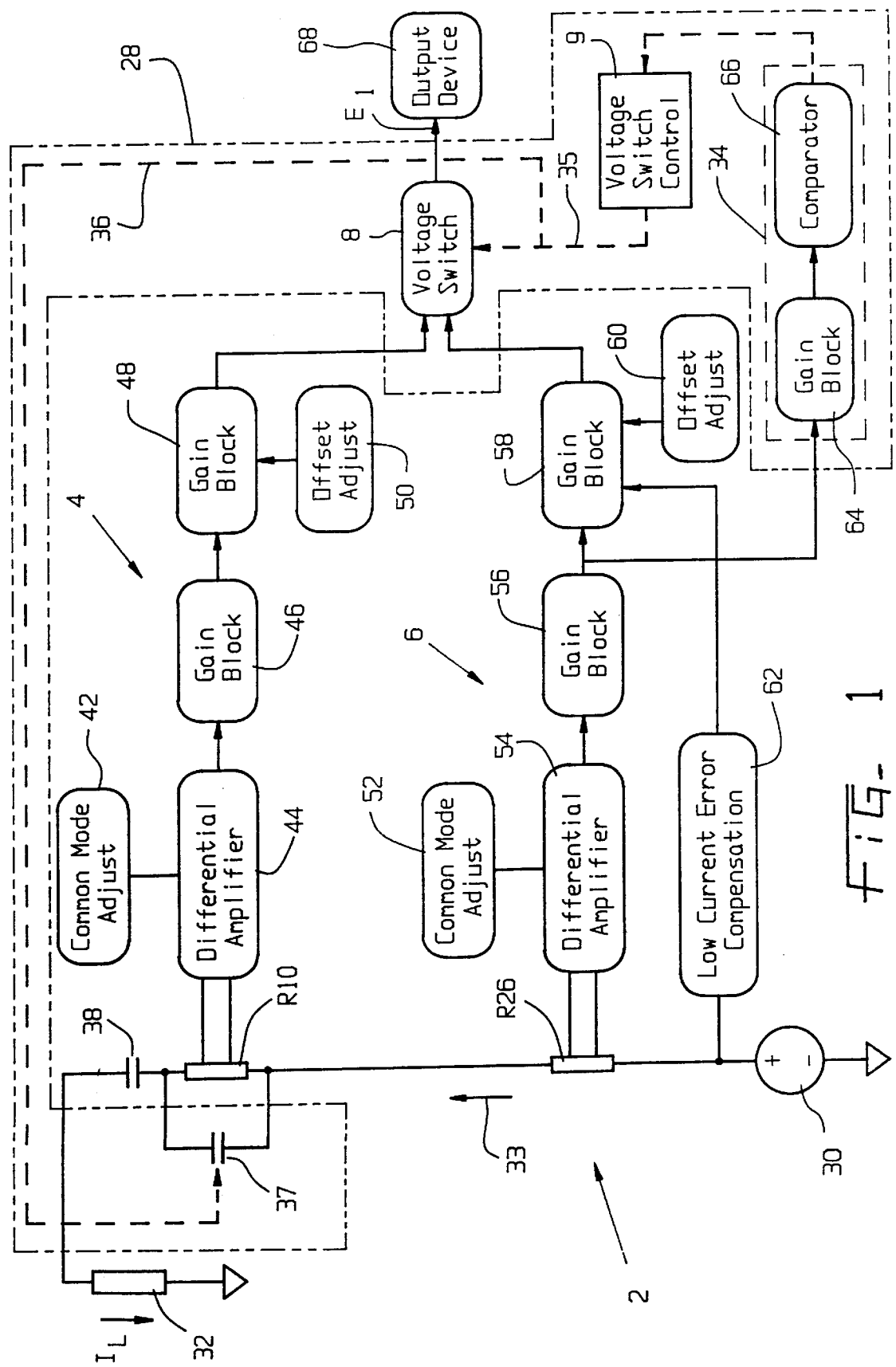
FIG. 1 is a block diagram of the auto ranging current monitor of the present invention.

Corresponding reference characters indicate corresponding parts throughout the several views. Although the drawings represent the preferred embodiment of the present invention, the drawings are not necessarily to scale and certain features may be exaggerated in order to better illustrate and explain the present invention. The exemplification set out herein illustrates the preferred embodiment of the invention, in one form, and such exemplifications are not to be construed as limiting the scope of the invention in any manner.

DETAILED DESCRIPTION OF THE PREFERRED EMBODIMENT

The embodiment disclosed below is not intended to be exhaustive or limit the invention to the precise form disclosed in the following detailed description.

As shown in FIG. 1, auto ranging current monitor 2 of the present invention comprises low current channel 4 and high current channel 6 connected to output device 68 through voltage switch 8 of channel switching circuit 28. Channel switching circuit 28 automatically selects the appropriate channel in response to the current to load 32. Current output device 68 comprises an analog to digital converter, a digital volt meter, an analog meter or any other conventionally known device suitable for outputting a current level.

The outputs of the current channels are voltage encoded to indicate which current channel is active. The preferred embodiment voltage encodes the output of high current channel 6. Current output device 68 is configured to be able to determine which current channel is selected based on the voltage encoding, decode the voltage encoded output, and output the actual load current level within the appropriate range.

As further shown in FIG. 1, the load circuit comprises low current shunt resistor R10, high current shunt resistor R26 and contact 38 of relay K2 disposed in series with power supply 30 and load 32. Closing contact 38 of relay K2 enables current to flow from power supply 30 to load 32 in the direction indicated by arrow 33. Also, contact 37 of relay K1 is disposed in parallel with low current channel shunt resistor R10. When high current channel 6 is selected, contact 37 closes to provide a short to remove shunt resistor R10 from the circuit.

Low current channel 4 comprises shunt resistor R10, differential amplifier 44 having common mode adjust 42, gain block 46, and gain block 48 having offset adjust 50. Differential amplifier 44 converts current through shunt resistor R10 to a voltage signal and gain blocks 46 and 48 amplify that voltage signal by factors of 10 and 8, respectively. The output of gain block 48 corresponds to a current level in the low current range and the output of gain block 48 is connected to voltage switch 8 of channel switching circuit 28. The output of low current channel 4 may be encoded by adjusting the output of offset adjust 50. In the preferred embodiment, zero offset is applied to gain block 48.

High current channel 6 comprises high current shunt resistor R26, differential amplifier 54 having common mode adjust 52, gain block 56, and gain block 58 having offset adjust 60. Differential amplifier 54 converts current through shunt resistor R26 to a voltage signal and gain blocks 56 and 58 amplify that voltage signal by factors of 20 and 25, respectively. The output of gain block 58 corresponds to a current level in the high current range and the output of gain block 58 is connected to voltage switch 8. The output of high current channel 6 can be encoded by adjusting the output of offset adjust 60. In the preferred embodiment, a 5 volt offset is added to the output of gain block 58.

Low current error compensation circuit 62 is applied to gain block 58 to adjust the output of high current channel 6 to compensate for parasitic current drawn by low current channel 4 when low current channel 4 is inactive. The current error compensation is necessary because a small amount of parasitic current is drawn by differential amplifier 44 even when low current shunt resistor R10 is short circuited by contact 37 of relay K1.

Channel switching circuit 28 automatically connects the output of either low current channel 4 or high current channel 6 to current output device 68, via voltage switch 8, depending on the current flowing into load 32. Output device 68 is not required to be part of the current monitor and may comprise an analog to digital converter (A/D), a digital volt meter (DVM), an analog meter or any other conventionally known device for displaying the current level to an operator or outputting the current level to another device.

Channel switching circuit 28 includes auto scale section 34, voltage switch 8 and contact 37. Voltage switch control 9 controls the operation of voltage switch 8 and contact 37. Voltage switch 8 comprises a set of contacts 39 and 40, shown on FIG. 2A, which are controlled as indicated by control line 35. The operation of voltage switch control 9 is controlled by auto scale section 34, which comprises gain block 64 and comparator 66. Comparator 66 compares the load current, measured via differential amplifier 54 and gain blocks 56 and 64, with a predetermined current level. If the load current is below the predetermined level, auto scale section 34 provides an output to voltage switch control 9 which selects low current channel 4. When low current channel 4 is selected, contact 37 is open to allow current flow through low resistance shunt resistor R10. If the output is above the predetermined level, auto scale section 34 provides a second output to voltage switch control 9 which selects high current channel 6. When high current channel 6 is selected, contact 37 is closed to remove low resistance shunt resistor R10 from the circuit.

Further details of the preferred embodiment of the auto ranging current monitor of the present invention are now described with reference to FIGS. 2–3.

Figure 2A:
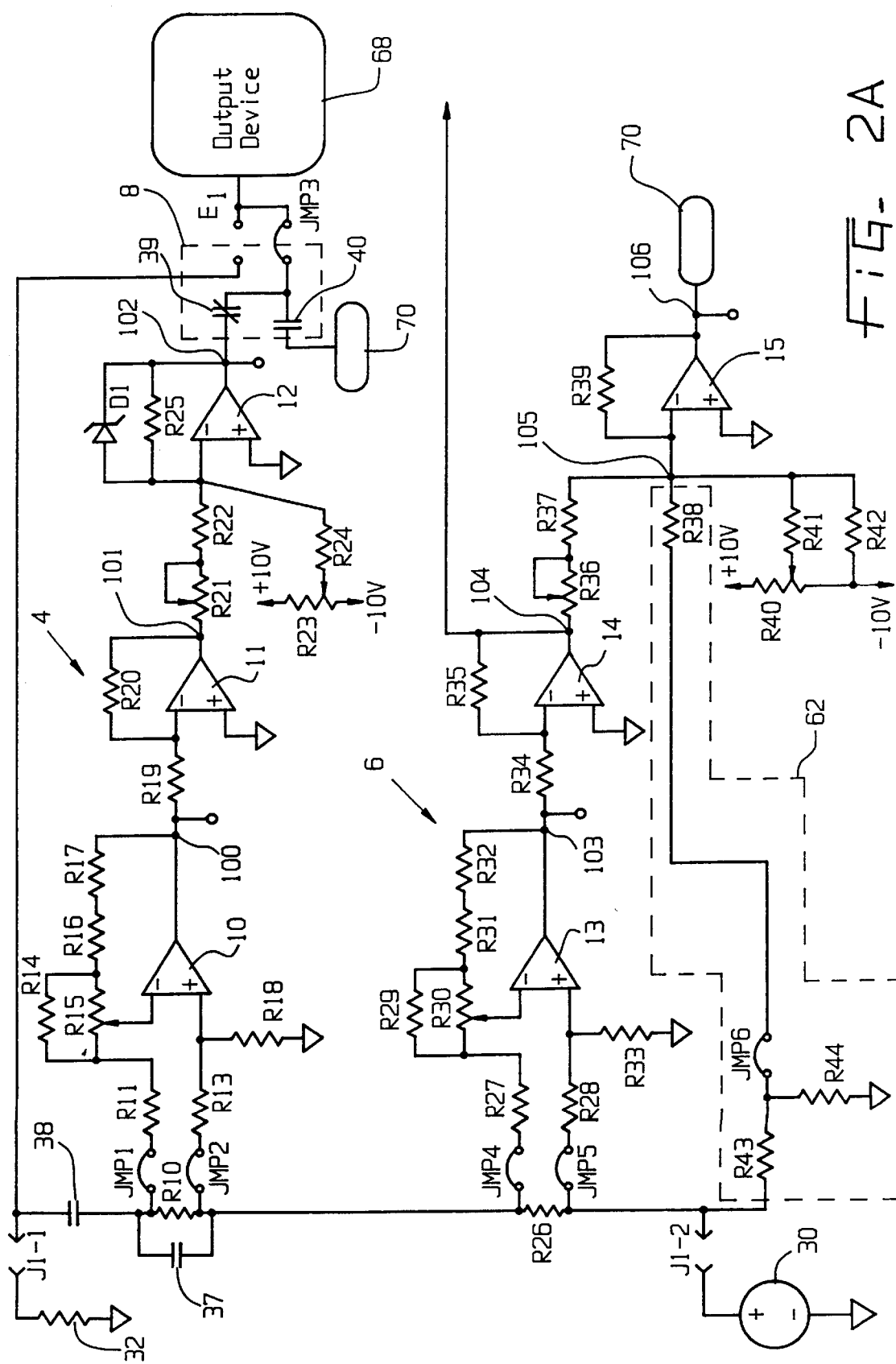

As shown in FIG. 2A, power supply 30 is connected to load 32 through connector J1-1, low current shunt resistor R10, high current shunt resistor R26, contact 38 of relay K2 and connector J1-2.

In low current channel 4, differential amplifier 44 having common mode adjust 42 comprises op amp 10 and resistors R11–18 arranged in a conventional inverting differential amplifier configuration with the common mode error correction feature of the present invention. Resistors R14, R15 and R17 are added to the conventional differential amplifier configuration to provide common mode error correction capability. Resistor R17 is provided to match the impedances on either side of the wiper of potentiometer R15, thus, the value of resistor R17 depends on the value of shunt resistor R10 and should be nominally equal to R10. When R10 is small, i.e., less than 1 ohm, a practical value for R17 is zero ohms. If R10 were a higher value, i.e., 5 ohms, then R17 should be 5 ohms. Details of the common mode error correction feature of the present invention will be discussed later in this application with reference to FIGS. 4–5.

Current through shunt resistor R10 is converted to a voltage signal at node 100 by differential amplifier 44. The voltage signal at node 100 is then amplified by op amps 11 and 12 which are also each arranged in a conventional inverting amplifier configuration with their respective associated resistors. The values of resistors R19 and R20 are adjusted to provide a gain of 10 and the values of resistors R21, R22 and R25 are adjusted to provide a gain of 8. Zener diode D1 clamps the voltage across resistor R25 to prevent the output of op amp 12 output from going into voltage saturation.

An offset to the output of op amp 12 may be added by offset adjust 50 which comprises a voltage input network comprising potentiometer R23 and resistor R24. The amount of offset can be adjusted by adjusting the wiper on potentiometer R23 to add a predetermined voltage offset to the inverting input of op amp 12. The reference voltages for the voltage input network are +10 V and –10 V, as shown in FIG. 2A. The voltage offset to the inverting input of op amp 12 in the present embodiment is adjusted to zero, and thus does not affect the output of low current channel 4.

In high current channel 6, differential amplifier 54 having common mode adjust 52 comprises op amp 13 and resistors R27–33 arranged in a configuration similar to op amp 10. Resistors R29, R30 and R32 are added to the conventional differential amplifier configuration to provide common mode error correction capability. Resistor R32 is provided to match the impedances on either side of the wiper of potentiometer R30, thus, the value of resistor R32 depends on the value of shunt resistor R26 and should be nominally equal to R26. When R26 is small, i.e., less than 1 ohm, a practical value for R32 is zero ohms. If R26 were a higher value, i.e., 5 ohms, then R32 should be 5 ohms. Again, details of the common mode error correction feature of the present invention will be discussed later in this application with reference to FIGS. 4–5.

Current through shunt resistor R26 is converted to a voltage signal at node 103 by differential amplifier 54. The voltage is then amplified by op amps 14 and 15 which are also each arranged in a conventional inverting amplifier configuration with their associated resistors.

An offset to the input of op amp 15 may be added by offset adjust 60 which comprises a voltage input network comprising potentiometer R40 and resistors R41–42. The reference voltages for the voltage input network are +10 V and –10 V, as shown in FIG. 2A. The amount of offset is adjusted by adjusting the wiper on potentiometer R40. The voltage input network of the present embodiment is adjusted to add a 5 volt offset at the output of op amp 15, and thus adds a 5 volt offset to the output of high current channel 6.

Voltage encoding the output of high current channel 6 by adding a 5 volt offset allows output device 68 to determine which current channel is active based solely on the voltage level output of voltage switch 8. An output of voltage switch 8 below 5 volts indicates that low current channel 4 is selected and an output above 5 volts indicates that high current channel 6 is selected. Voltage output device 68 may comprise any conventional device for recognizing the presence of the offset and decoding the output current as necessary by using, for example, additional circuitry or embedded software. Such devices may include, but are not limited to, a conventional DVM, a voltage to frequency converter and computer combination, an A/D and microprocessor combination, a conventional DVM and computer combination with a CRT output.

High current channel 6 also includes low current error compensation circuit 62 which adjusts the output of high current channel 6 to compensate for parasitic current drawn by low current channel 4 when low current channel 4 is inactive. This error compensation is required because the short created by closing contact 37 of relay K1 is not perfect in diverting all of the current away from low current channel 4 and a small amount of parasitic current flows through R13 and R18 into ground even when contact 37 is closed. Therefore, the current measured by high current channel 6 is actually a sum of the current flowing into load 32 and the parasitic current drawn by low current channel 4. Current error compensation circuit 62 removes the parasitic current component so that the high current channel output reflects only the load current. Although high current channel 6 may also draw some parasitic current when low current channel 4 is active, this second parasitic current does not affect the measurement of the load current. Since low current shunt resistor R10 is located between high current shunt resistor R26 and load 32, the current flowing through low current shunt resistor R10 always equals the load current.

Since the parasitic current drawn by low current channel 4 is known to be proportional to the input voltage, low current error compensation circuit 62 comprises a voltage divider network, which includes resistors R38, R43 and R44, directly connected between power supply 30 and op amp 15 of high current channel 6. The current error compensation circuit 62 applies an offset voltage, which in this case is proportional to the power supply voltage and is scaled such that it cancels the parasitic current caused by low current channel 4, to the inverting input of op amp 15.

Channel switching circuit 28 selectively provides the output of low current channel 4 or high current channel 6 to output device 68. Channel switching circuit 28 comprises voltage switch control 9 which controls the operation of voltage switch 8. Voltage switch control 9 comprises coils of relays K1 and K3 are energized or deenergized by the output of comparator 66. Voltage switch 8 comprises contact 39 of relay K3 connected to output node 102 of op amp 12, and contact 40 of relay K3 connected to output node 106 of op amp 15. In FIG. 2A, the connection of node 106 to contact 40 is indicated by reference numeral 70. When the K3 relay coil is deenergized, contact 39 is closed and contact 40 is open, thus, the output of op amp 12 is connected to output device 68. When the K3 relay coil is energized, contact 39 is open and contact 40 is closed, thus, the output of op amp 15 is connected to output device 68. Although relay coils and associated contacts are shown as a mechanism for switching the output of the current monitor in the preferred embodiment, it is clear that a number of alternative devices and means may be employed to perform the switching function. Such alternatives devices include, but are not limited to, analog switches, field effect transistors, and integrated circuit switches.

FIG. 2B shows the components of auto scale section 34 which controls the operation of voltage switch control 9. In auto scale section 34, gain block 64 comprises op amp 16 arranged in a conventional inverting amplifier configuration with resistors R45–47 and zener diode D2, and comparator 66 comprises voltage comparator 17 arranged in a non-inverting hysteresis comparator configuration with resistors R48–49. Zener diode D2 is connected across feedback resistor R47 to prevent op amp 16 from going into output voltage saturation. The output of voltage comparator 17 switches states to energize the coils of relays K1 and K3 via inverter U1.

The output of voltage comparator 17 at node 108 is high when the signal at node 107A is greater than the 0.7 V reference level, and low when the signal at node 107A is less than the 0.7 V reference level. Voltage comparator 17 of comparator 66 is configured with positive feedback using pull up resistor R50 and feedback resistor R49 to force the output of op amp 17 to change rapidly and incorporate a certain amount of hysteresis into the switching operation. The hysteresis width is determined by the values of resistors R48–50. In the preferred embodiment, the resistors R48–50 are set to provide a 2 mA hysteresis width. This built-in hysteresis prevents excessive switching back and forth of the current channels near the switching point, i.e. "chattering". When the output of voltage comparator 17 is in a low state (about 0.25 volts in a circuit using the values given below) and the voltage at the non-inverting input (node 107A) of voltage comparator 17 exceeds 0.7 V, the output of op amp 17 changes rapidly due to the positive feedback action through resistor R49. To switch back to a low state, the voltage at the non-inverting input of op amp 17 must be below the voltage level at which op amp 17 switched to the high state. The change to the low state is also abrupt due to the positive feedback action. When the load current exceeds a predetermined threshold level, the output of U1 at node 109 energizes relay coils K1 and K3. This action connects the output of high current channel 6 to output device 68 by opening contact 39 and closing contacts 37 and 40. "FIG. 3 is a schematic diagram of an on/off control circuit for the K2 relay. As indicated in reference to FIG. 1, the K2 relay operates the contact 38, which couples low current sensor R10 to the load 32. The logic level input of the circuit, designated as J2-1 in FIG. 3, is coupled to the relay coil K2 substantially as described above in reference to relay coils K1 and K3 of FIG. 2B. Thus, the resistors R52 and R53 correspond to the resistors R50 and R51, the inverter U2 corresponds to the inverter U1, the diode D4 corresponds to the diode D3, and the indicator LED DS2 corresponds to the indicator LED DS1. A low logic signal applied to the input J2-1 energizes the relay coil K2 to close the contact 38, connecting the low current sensor R10 to the load 32."

Figure 6:
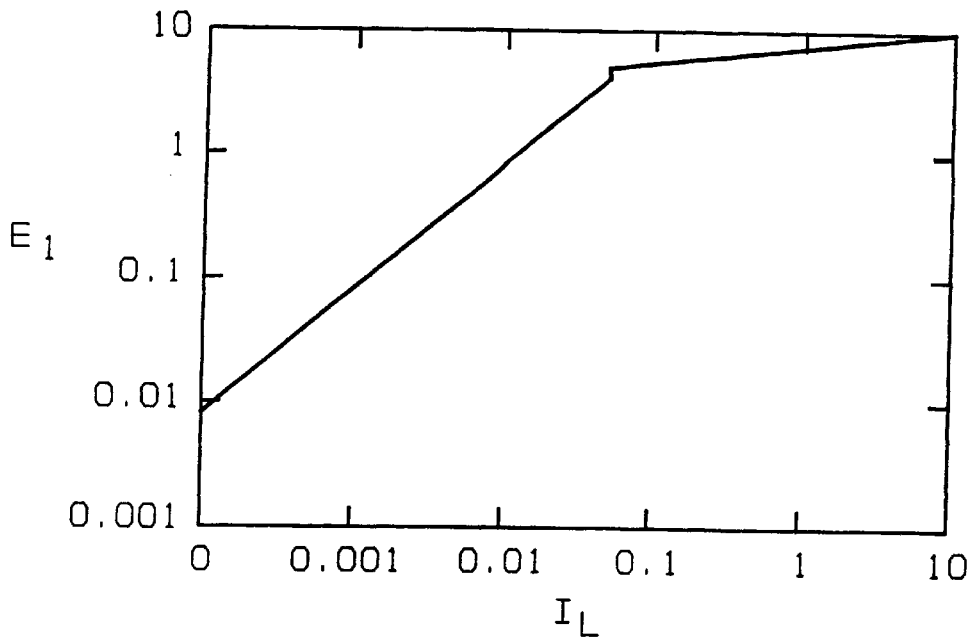
FIG. 6 is a graph showing the low current and high current operating regions of the auto ranging current monitor of the present invention.
Figure 7:
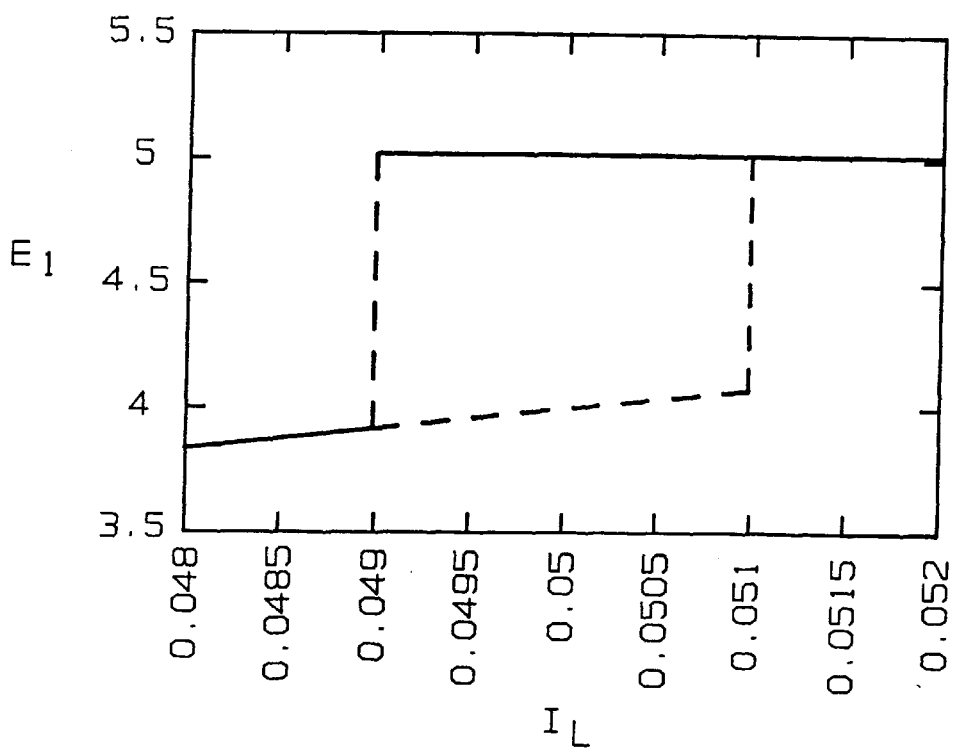
FIG. 7 is a graph showing the built in hysteresis at the transition between the low current and high current operating regions of the auto ranging current monitor of the present invention.

FIG. 6 illustrates the low current region and the high current region of the current monitor, wherein the switching between the two regions occurs at around 50 mA. FIG. 7 is a detailed illustration of the transition region showing the built in hysteresis. As the current increases, the current monitor selects high current channel 6 when the current reaches 51 mA. As the current decreases, the current monitor selects low current channel 4 when the current reaches 49 mA. The built in hysteresis prevents excessive cycling, i.e. chattering, of the contacts associated with relays K1 and K3 when the current is around 50 mA. The hysteresis width may be adjusted as necessary.

The overall operation of the current monitor of the present invention is now described.

Upon start up, assuming initial current is less than a predetermined threshold level, 51 mA in this case, the voltage signal to the non-inverting input of voltage comparator 17 is lower than the 0.7 V reference level at the inverting input of voltage comparator 17 and the output at node 108 remains low and the output at node 109 remains high, thus the K1 and K3 relay coils remain deenergized. Therefore, contact 37 remains open allowing current to flow through low current channel shunt resistor R10 and the voltage signal at node 102 corresponds to the load current. Contact 39 remains closed while contact 40 remains open, thus the output of low current channel 4 is provided to output device 68.

Since no offset is added to the output of low current channel 4, the current level output to output device 68 is less than 5 volts indicating that the measurement is from low current channel 4. Output device 68 then provides the measured current on the low current scale to an operator or another device.

When the current rises above the predetermined threshold level, 51 mA in this case, the voltage signal to the noninverting input of voltage comparator 17 is greater than the 0.7 V reference level at the inverting input, the output of node 108 goes high, and the output at node 109 goes low, thereby energizing the coils of relays K1 and K3. Energizing the K1 relay coil closes contact 37 to short circuit shunt resistor R10 and remove low current channel 4 from the circuit. Energizing the K3 relay coil opens contact 39 and closes contact 40. Now, the output of high current channel 6 is provided to output device 68.

Since a 5 volt offset has been added, the output of voltage switch 8 is greater than 5 volts and indicates that the measurement is from high current channel 6. Output device 68 then removes the offset, using for example, embedded software or additional circuitry, to provide the actual load current level to an operator to another device.

While high current channel 6 is selected, low current error compensation circuit 62 continuously provides a compensating input to voltage comparator 15 to compensate for the parasitic currents drawn by resistors R13 and R18.

The current monitor continues to operate in the high current region until the load current falls below a predetermined level, 49 mA in this case. At that point, the coils of relays K1 and K3 are deenergized, thereby removing the short circuit around the low current shunt resistor by opening contact 37 and selecting low current channel 4 by closing contact 39 and opening contact 40.

Figure 4:
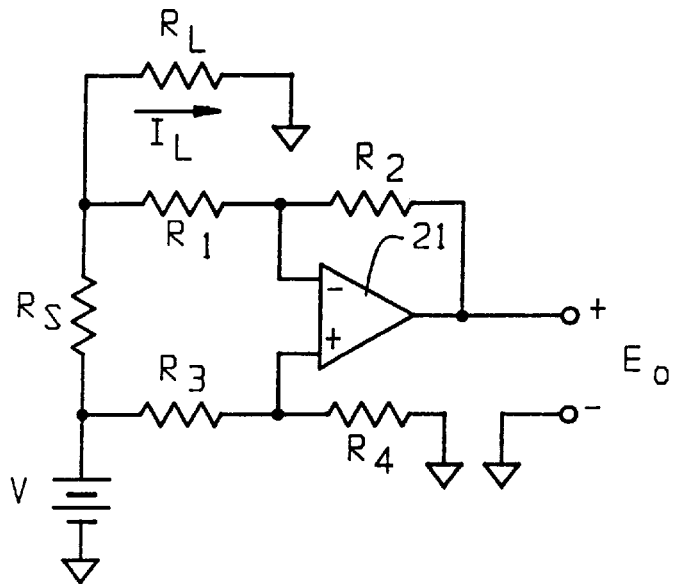
FIG. 4 is a schematic diagram of a typical differential amplifier configuration.

The common mode error correction feature embodied in common mode adjuster 42 and common mode adjuster 52 will now be described using FIGS. 4 and 5. FIG. 4 shows a typical differential amplifier configuration comprising op amp 21 and resistors R1–4, shunt resistor $R_S$, and load resistor $R_L$. Using conventional analytical techniques, $E_0$ is found to be:

$$E_0 = V * \left(\frac{R_4}{R_3 + R_4}\right) * \left(1 + \frac{R_2}{R_1}\right) - \quad \text{Eq. 1}$$

$$V * \frac{R_2}{R_1} + V * R_S * \frac{R_2}{R_1} * \left[\frac{R_3}{(R_S + R_1) * (R_3 + R_4)}\right] +$$

-continued $$I_L * R_S * \frac{R_2}{R_1} - I_L * R_S * \frac{R_2}{R_1} * \left(\frac{R_S}{R_S + R_1}\right)$$

Now if $R_1$ is set equal to $R_2$ and $R_3$ is set equal to $R_4$, then:

$$E_0 = \frac{1}{2} * V * \frac{R_S}{R_S + R_1} + I_L * R_S - I_L * \frac{R_S^2}{R_S + R_1} \quad \text{Eq. 2}$$

wherein $$\frac{1}{2} * V * \frac{R_S}{R_S + R_1}$$

is the common mode voltage error term, and $$I_L * \frac{R_S^2}{R_S + R_1}$$

is the current gain error term.

The goal is to reduce the common mode voltage error term to zero. To do this, $R_1$, $R_2$, $R_3$ and $R_4$ may have to be set to other than equal values. In this regard, Eq. 1 is first solved for $R_2$ under the condition that $E_0$ is equal to zero when $I_L$ is equal to zero and V is equal to some non-zero value.

$$0 = \left[V * \left(\frac{R_4}{R_3 + R_4}\right) * \left(1 + \frac{R_2}{R_1}\right) - V * \frac{R_2}{R_1}\right] + \quad \text{Eq. 3}$$

$$V * R_S * \frac{R_2}{R_1} * \left[\frac{R_3}{(R_S + R_1) * (R_3 + R_4)}\right]$$

Solving eq. 3 for $R_2$ yields:

$$R_2 = (R_S + R_1) * \frac{R_4}{R_3} \quad \text{Eq. 4}$$

Further, if $$(R_S + R_1) * \frac{R_4}{R_3}$$

is substituted into eq. 1 for $R_2$, eq. 1 becomes:

$$E_0 = V * \frac{R_4}{(R_3 + R_4)} * \left[1 + (R_S + R_1) * \frac{R_4}{(R_3 * R_1)}\right] - \quad \text{Eq. 5}$$

$$V * (R_S + R_1) * \frac{R_4}{R_3 * R_1} + V * R_S * \left[\frac{R_4}{R_1 * (R_3 + R_4)}\right] +$$

$$I_L * R_S * (R_S + R_1) * \frac{R_4}{(R_3 * R_1)} - I_L * R_S^2 * \frac{R_4}{(R_3 * R_1)}$$

Simplifying eq. 5 yields:

$$E_0 = I_L * R_S * \frac{R_4}{R_3} \quad \text{Eq. 6}$$

Eq. 6 is significant because it shows that using the above configuration, not only the common mode voltage error term, but also the current gain error term, are eliminated.

Figure 5:
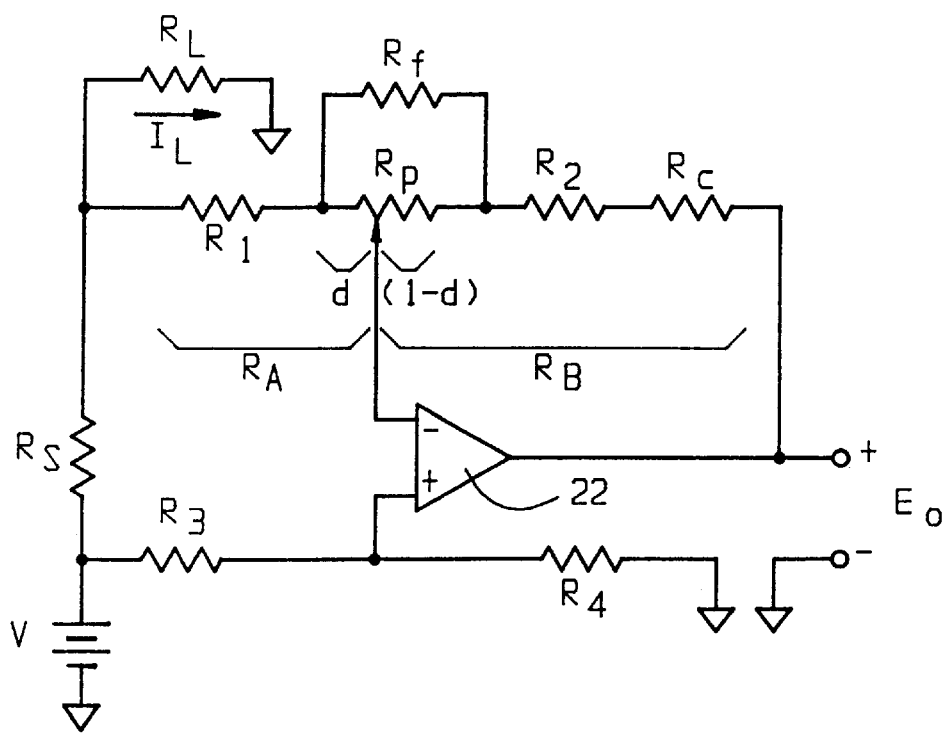
FIG. 5 is a schematic diagram of common mode error correction incorporated into a differential amplifier of the current monitor of the present invention.

A practical implementation of the above, which is incorporated into the differential amplifiers of the low and high current channels of the present current monitor, is shown in FIG. 5. In FIG. 5, $R_p$ is much greater than $R_f$ and $R_f$ is disposed in parallel with $R_p$ to limit the adjustment range of $R_p$. Therefore, the effective resistance of the parallel connection of $R_f$ and $R_p$ is approximately $R_f$, wherein the movement of the wiper on $R_p$ provides a fine change in the effective resistance. As such, $R_A = R_1 + d*R_f$, where d is the divider coefficient of potentiometer $R_p$ and has a range of 0 to 1. Also, $R_B = (1-d)*R_f + R_2 + R_c$, where d again equals the divider coefficient of $R_p$. Since negligible current is drawn from the wiper of $R_p$ and $R_f$ is much smaller than $R_p$, $R_p$ appears to be a potentiometer with an effective value equal to $R_f$. $R_A$ and $R_B$ of FIG. 5 are representative of $R_1$ and $R_2$, respectively, of FIG. 4. Writing eq. 4 in terms of $R_A$ and $R_B$ yields:

$$R_B = (R_S + R_A) * \frac{R_4}{R_3} \quad \text{Eq. 7}$$

When the appropriate substitutions are made of $R_A$ and $R_B$, eq. 7 becomes:

$$(1 - d) * R_f + R_2 + R_C = (R_S + R_1 + d * R_f) * \frac{R_4}{R_3} \quad \text{Eq. 8}$$

If $R_1$ is set equal to $R_2$, $R_c$ is set equal to $R_s$, and $R_4/R_3$ is set equal to 1, then eq. 8 becomes:

$$(1-d)*R_f = d*R_f \quad \text{Eq. 9}$$

Solving eq. 9 for d yields:

$$d=0.5$$

Thus, under the above specified conditions, the common mode offset error and the current gain error has been eliminated. In practice, $R_1$ is not exactly equal to $R_2$, $R_3$ is not exactly equal to $R_4$, and certainly $R_c$ is not exactly equal to $R_s$. Therefore, adjustment potentiometer $R_p$ is added to the circuit. By adjusting $R_p$, the relationship of eq. 7 can be satisfied and the common mode error term can be eliminated.

The present invention maybe practiced by using the following values for the circuit elements described above:

| Label | Value | Label | Value |
| --- | --- | --- | --- |
| R10 | 1.0Ω, 0.5% | D1 | IN 4740A, 10V, 5% |
| R11 | 10KΩ, 0.1% | D2 | IN 4740A, 10V, 5% |
| R13 | 10KΩ, 0.1% | D3 | IN4004 |
| R14 | 4.02Ω, 1% | D4 | IN4004 |
| R15 | 2KΩ | 10–16, | OP400G |
| R16 | 10KΩ, 0.1% | 17 | LM339N |
| R17 | 0Ω | U1 | ULN2803A |
| R18 | 10KΩ, 0.1% | U2 | ULN2803A |
| R19 | 1.0KΩ, 0.1% | | |

-continued

| Label | Value | Label | Value |
|---|---|---|---|
| R20 | 10.0KΩ, 0.1% | | |
| R21 | 200Ω | | |
| R22 | 1.74KΩ, 1% | | |
| R23 | 10KΩ | | |
| R24 | 2MΩ | | |
| R25 | 14.7KΩ, 1% | | |
| R26 | 0.025Ω, .5% | | |
| R27 | 10KΩ, 0.1% | | |
| R28 | 10KΩ, 0.1% | | |
| R29 | 4.02Ω, 1% | | |
| R30 | 2KΩ | | |
| R31 | 10KΩ, 0.1% | | |
| R32 | 0Ω | | |
| R33 | 10KΩ, 0.1% | | |
| R34 | 1.0KΩ, 0.1% | | |
| R35 | 20.0KΩ, 0.1% | | |
| R36 | 1KΩ | | |
| R37 | 9.53KΩ, 1% | | |
| R38 | 2.0MΩ, 1% | | |
| R39 | 10.0KΩ, 1% | | |
| R40 | 10KΩ | | |
| R41 | 1.0MΩ, 1% | | |
| R42 | 20.0KΩ, 1% | | |
| R43 | 10.0KΩ, 1% | | |
| R44 | 100Ω, 1% | | |
| R45 | 1KΩ | | |
| R46 | 9.53KΩ, 1% | | |
| R47 | 249KΩ, 1% | | |
| R48 | 619Ω, 1% | | |
| R49 | 9.31KΩ, 1% | | |
| R50 | 10KΩ | | |
| R51 | 2KΩ | | |
| R52 | 10KΩ | | |
| R53 | 2KΩ | | |

While this invention has been described as having an exemplary design, the present invention may be further modified within the spirit and scope of this disclosure. For example, the signals generated by the circuitry of the present invention may take many forms, such as voltage levels, logic levels, polarity, current levels, frequencies, pulse width modulations etc., and these signals could be manipulated using digital techniques. This application is therefore intended to cover any variations, uses, or adaptations of the invention using its general principles. Further, this application is intended to cover such departures from the present disclosure as come within known or customary practice in the art to which this invention pertains.

The embodiments of the invention in which an exclusive property or privilege is claimed are defined as follows:

1. A current monitor for measuring a load current level over a wide dynamic range in a circuit having a load supplied by a power source and outputting the load current level to an output device, comprising:
   a low current sensor and a high current sensor connected in series with the load and the power source;
   a low current channel having an input connected to the low current sensor and a low current output carrying a low current signal corresponding to the load current level within a low current range;
   a high current channel having an input connected to the high current sensor and a high current output carrying a high current signal corresponding to the load current level within a high current range; and
   a channel switching circuit responsive to the load current and coupled to said low current sensor and to said high and low current outputs for (1) providing said low current signal to said output device when the load current is below a predetermined thresholds, and (2) short circuiting said low current sensor and providing said high current signal to said output device when the load current is above said predetermined threshold.

2. The current monitor of claim 1, wherein said channel switching circuit further comprises a controller and an auto scaler, said auto scaler connected between said high current channel and said controller, said auto scaler having a comparator for comparing said high current channel output with said predetermined threshold, said controller controlling the operation of said channel switching circuit in response to an output of said comparator.

3. The current monitor of claim 1, further comprising an offset adjust circuit coupled to said high current channel for adding a predetermined offset to said high current signal.

4. The current monitor of claim 1, further comprising a low current error compensator operatively coupled to said high current channel, said low current error compensator adjusting said high current signal by an amount proportional to a voltage level of the power source, wherein said high current sensor is connected between said low current sensor and the power supply.

5. The current monitor of claim 1, wherein said low and high current channels respectively include a differential amplifier with common mode error compensation for eliminating common mode voltage error and current gain error, each said differential amplifier including an inverting input, a noninverting input, an amplifier output, a shunt resistor, $R_s$, connected between the voltage source and a first resistor $R_1$, each said first resistor connected between respective said shunt resistor and an adjustment potentiometer, $R_p$, said adjustment potentiometer having a wiper and connected between said first resistor and a second resistor and further connected in parallel with a fifth resistor, $R_f$, said wiper connected to said inverting input, said second resistor connected between said adjustment potentiometer and a compensating resistor, $R_c$, said compensating resistor connected between said second resistor and said amplifier output, a third resistor, $R_3$, connected between said voltage source and said noninverting output, a fourth resistor, $R_4$, connected between ground and said noninverting input, a potentiometer divider coefficient d having a value between 1 and 0 determined by the position of said wiper, wherein:

$(1-d)*R_f+R_2+R_c=(R_s+R_1+d*R_f) R_4/R_3$.

6. The current monitor of claim 5, wherein:

$R_1=R_2$, $R_c=R_s$, and $R_4/R_3=1$.

7. A current monitor for measuring a load current level over a wide dynamic range in a circuit having a load supplied by a power source and outputting the load current level to an output means, comprising:
   a low current sensor and a high current sensor connected in series with the load and the power source;
   low current channel means connected to the low current sensor for measuring the load current within a low current range and developing a low current signal corresponding thereto;
   high current channel means connected to the high current sensor for measuring the load current within a high current range and developing a high current signal corresponding thereto; and
   channel switching means responsive to the load current for automatically outputting said low current signal to said output means when the load current is below a predetermined threshold and short circuiting said low current sensor and providing said high current signal to said output means when the load current is above said predetermined threshold.

8. The current monitor of claim 7 wherein said channel switching circuit comprises an auto scaler means operatively connected to said high current channel for controlling the operation of said channel switching circuit in response to the load current level.

9. The current monitor of claim 8, wherein said auto scaler means comprises a comparator means for comparing the load current level to a predetermined reference level.

10. The current monitor of claim 7, further comprising means coupled to said high current channel for adding a predetermined offset to said high current signal.

11. The current monitor of claim 7, further comprising a low current error compensator means operatively coupled to said high current channel means for adjusting said high current signal by an amount proportional to a voltage level of the power source, wherein said high current sensor is connected between said low current sensor and the power supply.

12. The current monitor of claim 7, wherein said low and high current channels respectively include a differential amplifier with common mode error compensation for eliminating common mode voltage error and current gain error, each said differential amplifier including an inverting input, a noninverting input, an amplifier output, a shunt resistor, $R_s$, connected between the voltage source and a first resistor $R_1$, each said first resistor connected between respective said shunt resistor and an adjustment potentiometer, $R_p$, said adjustment potentiometer having a wiper and connected between said first resistor and a second resistor and further connected in parallel with a fifth resistor, $R_f$, said wiper connected to said inverting input, said second resistor connected between said adjustment potentiometer and a compensating resistor, $R_c$, said compensating resistor connected between said second resistor and said amplifier output, a third resistor, $R_3$, connected between said voltage source and said noninverting output, a fourth resistor, $R_4$, connected between ground and said noninverting input, a potentiometer divider coefficient d having a value between 1 and 0 determined by the position of said wiper, wherein:

$(1-d)*R_f+R_2+R_c=(R_s+R_1+d*R_f) R_4/R_3$.

13. The current monitor of claim 12, wherein: $R_1=R_2$, $R_c=R_s$, and $R_4/R_3=1$.

\* \* \* \* \*